US008119479B2

(12) United States Patent
Da et al.

(10) Patent No.: US 8,119,479 B2
(45) Date of Patent: Feb. 21, 2012

(54) SCALABLE FLASH EEPROM MEMORY CELL WITH FLOATING GATE SPACER WRAPPED BY CONTROL GATE AND METHOD OF MANUFACTURE

(75) Inventors: Jin Da, Shanghai (CN); Yun Yang, Shanghai (CN); Wei Lu, Shanghai (CN); Zhong Shan Hong, Shanghai (CN); Zuo Ya Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/887,496

(22) Filed: Sep. 21, 2010

(65) Prior Publication Data

US 2011/0089479 A1 Apr. 21, 2011

(30) Foreign Application Priority Data

Oct. 20, 2009 (CN) .......................... 2009 1 0197442

(51) Int. Cl.
*H01L 21/336* (2006.01)
(52) U.S. Cl. .... 438/257; 438/211; 438/264; 257/E21.68

(58) Field of Classification Search ................... 438/257, 438/211, 264, 267, 266; 257/E21.68
See application file for complete search history.

(56) References Cited

U.S. PATENT DOCUMENTS

| 6,621,115 | B2 | 9/2003 | Jenq et al. |
| 2007/0126050 | A1* | 6/2007 | Kim .............................. 257/315 |

* cited by examiner

*Primary Examiner* — Julia Slutsker
(74) *Attorney, Agent, or Firm* — Kilpatrick Townsend and Stockton LLP

(57) ABSTRACT

A polysilicon spacer as a floating gate of a Flash memory device. An advantage of such spacer structure is to reduce a cell size, which is desirable for state-of-the-art Flash memory technology. In a preferred embodiment, the floating gate can be self-aligned to a nearby and/or within a vicinity of the select gate of the cell select transistor. In a preferred embodiment, the present invention preserves a tunnel oxide layer after the removal, using dry etching, a polysilicon spacer structure on the drain side of the select transistor gate. More preferably, the present method provides for a certain amount of tunnel oxide to remain so as to prevent the active silicon area in the drain region of the memory cell from being etched by the dry etching gas.

20 Claims, 7 Drawing Sheets

SCALABLE FLASH EEPROM MEMORY CELL WITH FLOATING GATE SPACER WRAPPED BY CONTROL GATE AND METHOD OF MANUFACTURE

This application claims priority to Chinese Application No. 200910197442.9; filed on Oct. 20, 2009; commonly assigned, and incorporated in its entirety by reference herein for all purposes.

BACKGROUND OF THE INVENTION

The present invention is directed to integrated circuits and their processing for the manufacture of semiconductor devices. More particularly, the invention provides a method and device for manufacturing a memory device including a flash memory device, which can be embedded on other applications. For example, the invention can be applied to embedded flash memory designs on logic, digital signal processing, microprocessor, micro-controller, and others devices.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence or absence of charge on the floating gate. The charge is generally sufficient to prevent conduction even when a normal logic signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable and programmable read-only memory ("EEPROM" or "E2PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Various types of Flash cells have been proposed and utilized by the semiconductor industry. As merely an example, a split gate type structure includes a floating gate and a control gate, which has a split type structure. Such split gate structure has been used by companies such as Silicon Storage Technology, Inc. Unfortunately, certain limitations exist with such split gate type cell. For example, split gate type cell is often difficult to shrink beyond a certain critical dimension such as 0.25 micron and below. These and other limitations of the conventional split gate cell have been described throughout the present specification and more particularly below.

From the above, it is seen that an improved technique for processing semiconductor devices is desired.

BRIEF SUMMARY OF THE INVENTION

According to the present invention, techniques including methods for the manufacture of semiconductor devices are provided. More particularly, the invention provides a method and device for manufacturing a memory device including a Flash Memory device, which can be embedded on other applications. For example, the invention can be applied to embedded Flash Memory designs on logic, digital signal processing, microprocessor, micro-controller, and others devices.

In a specific embodiment, the present invention provides a method for fabricating a flash memory device. The method includes providing a semiconductor substrate, which has a surface region. In an embodiment, the semiconductor substrate can be a single crystal silicon, silicon germanium, silicon on insulator and the like. In another embodiment, the semiconductor substrate can be a silicon wafer. The method includes forming a flash memory device structure overlying a portion of the semiconductor substrate. In a preferred embodiment, the flash memory device structure has a select gate (e.g., polysilicon-1 layer) overlying the surface region. A first oxide spacer is formed overlying a first edge and a second oxide spacer is formed overlying a second edge of the select gate. A tunnel oxide layer is formed overlying a first region of the surface region and is also formed overlying a second region of the surface region. A first poly spacer is formed overlying the first oxide spacer on the first edge and is also formed overlying a portion of the first region. A second poly spacer is formed overlying the second oxide spacer on the second edge and is also formed overlying a portion of the second region. The method includes forming a filler material (e.g., organic material, barrier antireflective coating, other suitable material) overlying at least the first poly spacer, the second poly spacer, and exposed portions of the tunnel oxide layer. The method includes forming a masking layer overlying at least the first poly spacer, while exposing a spatial region within a vicinity of the second poly spacer. The method includes subjecting the spatial region within the vicinity of the second poly spacer to an etching process to remove a height of the second poly spacer, while maintaining a portion of the filler material. Additionally, the method includes removing exposed portions of the filler material, while maintaining the masking layer and selectively removing a remaining portion of the second poly spacer.

In an alternative specific embodiment, the present invention provides an alternative a method for fabricating a flash memory cell. The method includes providing a semiconductor substrate, which has a surface region including a first region and a second region. In a preferred embodiment, the semiconductor substrate is a silicon wafer. The method includes forming a flash memory device structure overlying the surface region of the semiconductor substrate. In a preferred embodiment, the flash memory device structure is interposed between the first and second regions and has a select gate overlying a gate dielectric layer, which isolates the select gate from the surface region. A first oxide spacer is formed overlying a first edge and a second oxide spacer is formed overlying a second edge of the select gate. A tunnel oxide layer is formed overlying the first and the second regions of the surface region. A first poly spacer is formed overlying the first oxide spacer on the first edge and is also formed overlying a portion of the first region. A second poly spacer is formed overlying the second the oxide spacer on the second edge and is also formed overlying a portion of the second region. The method includes forming a filler material (e.g., organic material, barrier antireflective coating) overlying at least the first poly spacer, the second poly spacer, and exposed portions of the tunnel oxide layer. The method includes forming a masking layer overlying at least the first poly spacer, while exposing a spatial region within a vicinity of the second poly spacer. The method further includes subjecting the spatial region within the vicinity of the second poly spacer to an etching process to remove a height of the second poly spacer, while maintaining a portion of the filler material. Additionally, the method includes removing exposed portions of the filler material, while maintaining the masking layer, and selectively removing a remaining portion of the second poly spacer. In a preferred embodiment, the present method maintains the tunnel oxide layer overlying the second region. The method also forms an ONO (i.e., oxide on nitride on oxide) layer overlying at least the first poly spacer and forming a control gate layer overlying the ONO layer.

In yet another embodiment, the present invention provides a flash memory cell having a split gate structure. The flash memory cell includes a substrate having a surface region and a flash memory device structure overlying the surface region. In a preferred embodiment, the flash memory device structure includes a gate dielectric layer overlying the surface region, a select gate overlying the gate dielectric layer, and a cap oxide layer overlying the select gate. An oxide spacer is formed overlying a first edge of the select gate, and a tunnel oxide layer is formed overlying a first region of the surface region and a second region of the surface region, wherein the second region is an active region. The oxide spacer on the first edge includes an overlying poly spacer, which in turn includes an overlying ONO (oxide on nitride on oxide) layer. The ONO layer isolates a control gate layer from the poly spacer, which serves as a floating gate structure.

In a preferred embodiment, the cap oxide layer has a thickness of about 1000 Angstroms and less. The oxide spacer has a thickness of about 300 Angstroms and less, and the poly spacer is about 1000 Angstroms and less.

In a specific embodiment, the present invention provides a polysilicon spacer structure as a floating gate of a Flash memory device. An advantage of such spacer structure is to reduce a cell size, which is desirable for state-of-the-art Flash memory technology. In a preferred embodiment, the floating gate can be self-aligned to a nearby and/or within a vicinity of the select gate of the cell select transistor. In a preferred embodiment, the present invention preserves a tunnel oxide layer after the removal, using dry etching, a polysilicon spacer structure on the drain side of the select transistor gate. More preferably, the present method provides for a certain amount of tunnel oxide to remain so as to prevent the active silicon area in the drain region of the memory cell from being etched by the dry etching gas.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. In a preferred embodiment, the present method overcomes any undesirable active region silicon loss, which may lead to source side dopant loss and flash memory reliability degradation. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques including methods for the manufacture of semiconductor devices are provided. More particularly, the invention provides a method and device for manufacturing a memory device including a Flash Memory device, which can be embedded on other applications. For example, the invention can be applied to embedded Flash Memory designs on logic, digital signal processing, microprocessor, micro-controller, and others devices.

Figure 1:
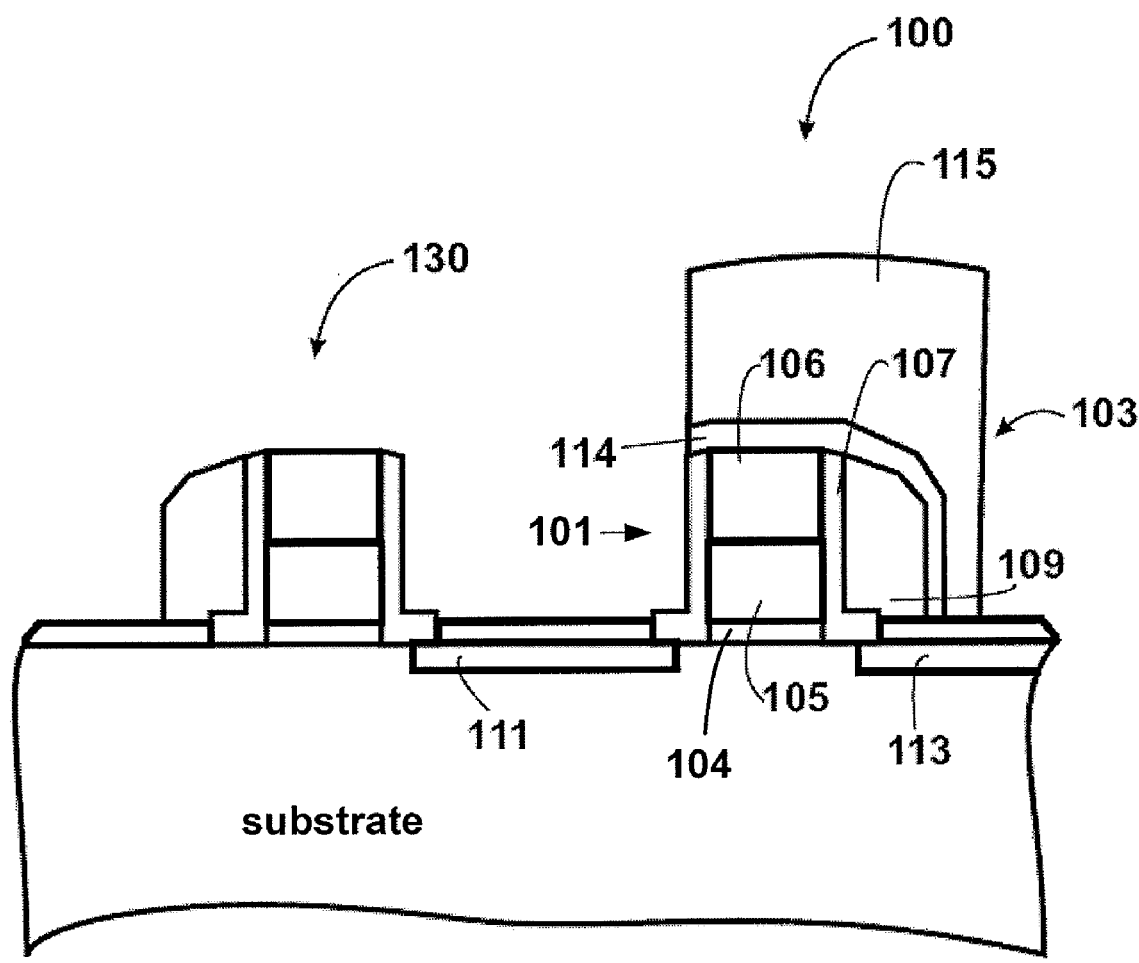
FIG. 1 is a simplified cross-sectional view diagram of a Flash memory device according to an embodiment of the present invention.

FIG. 1 is a simplified cross-sectional view diagram of a Flash memory device 100 according to an embodiment of the present invention. This diagram is merely an example, which should not unduly limit the scope of the claims herein. One of ordinary skill in the art would recognize many other variations, modifications, and alternatives. As shown, the Flash memory device includes a substrate having a first region 111 and a second region 113, a flash memory cell structure 103, which is interposed between the first and second regions and includes a select gate structure 101. The select gate structure includes a first polysilicon layer 105 overlying a gate dielectric layer 104, which isolates the select gate layer 105 from the substrate. The first polysilicon layer 105 serves as a select gate according to an embodiment and is defined by a first polysilicon layer. The flash memory cell structure also includes a cap oxide layer 106 formed overlying the select gate 105. An insulating material 107 is formed on an edge region of the select gate structure and serves as an inter-gate insulating layer. A polysilicon sidewall spacer structure 109, which is a floating gate structure, is formed overlying the inter-gate insulating layer. The polysilicon sidewall spacer structure is formed using a second polysilicon layer. A source/drain region is formed in the first and second regions 111 and 113.

The flash memory cell structure further includes an oxide on nitride on oxide structure ("ONO") 114 formed overlying the floating gate structure. A control gate 115 is formed overlying the ONO layer. The device also includes interlayer dielectric materials, metallization, and other elements. Further details of the electrical connection are provided throughout the present specification and more particularly below. As shown, source/drain region 111 is common to Flash memory cells 103 and 130. Further details of these elements are described throughout the present specification and more particularly below.

Cell programming is performed using source side hot electron injection. Hot electrons are generated in a gap between a source region of the cell and an inversion layer in the presence of a high lateral electric field. The inversion layer includes a substrate region under a select gate. A vertical electric field flows into the bulk of the substrate, part of the hot electrons would be swept across a tunnel oxide under a floating gate and remain on the floating gate. Enough electrons are collected on the floating gate to prevent a big current flow across a gap between an inversion region under a select gate and a source region under the floating gate during read, the cell is in a programmed state. Cell erase is performed using Fowler-Nordheim tunneling across a tunnel oxide layer. A split voltage scheme is used to prevent a high voltage in the source region. A positive voltage is applied to the source and a negative voltage is applied to a control gate. The electric field strength across the tunnel oxide layer is related to the voltage on a floating gate. To facilitate Fowler-Nordheim tunneling across the tunnel oxide, a coupling ratio of the control gate to the floating gate is maximized. The coupling ratio of the control gate to the floating gate is a ratio of a capacitance between the floating gate and the control gate and a total capacitance of the floating gate. The total capacitance of the floating gate includes also a tunnel oxide capacitance between the floating gate and the substrate.

Figure 2:
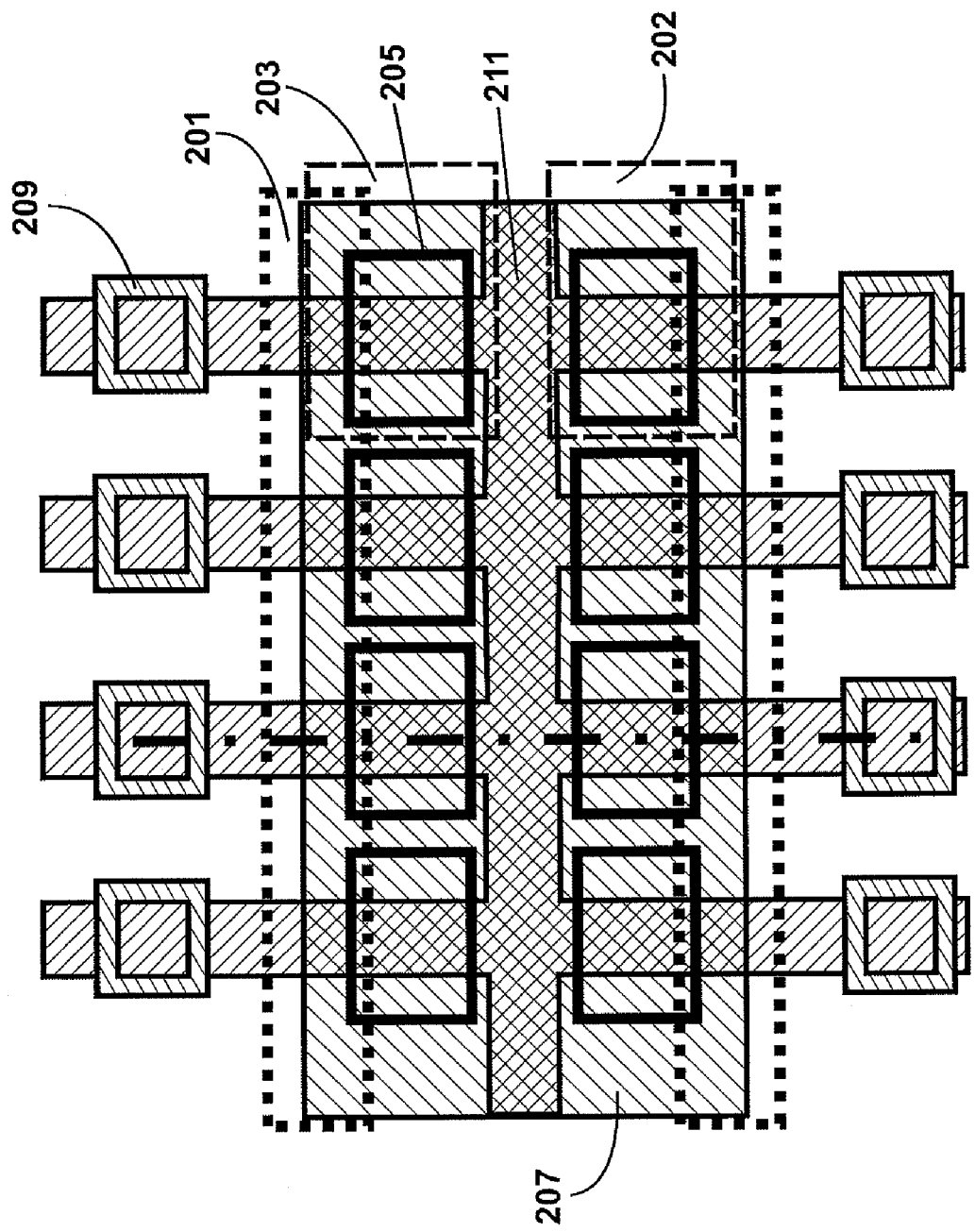
FIG. 2 is a simplified top-view diagram of a Flash memory device according to an embodiment of the present invention.

FIG. 2 is a simplified top-view diagram of a Flash memory device according to an embodiment of the present invention. This diagram is merely an example, which should not unduly limit the scope of the claims herein. As shown in FIG. 2, the top view diagram includes select gate 201 and memory devices 203. A floating gate 205 and a control gate 207 are also shown. The select gate is provided between an active region 209 and source/drain region 211. Source/drain region 211 is common to memory devices 202 and 203. One of ordinary skill in the art would recognize many other variations, modifications, and alternatives.

Figure 3:
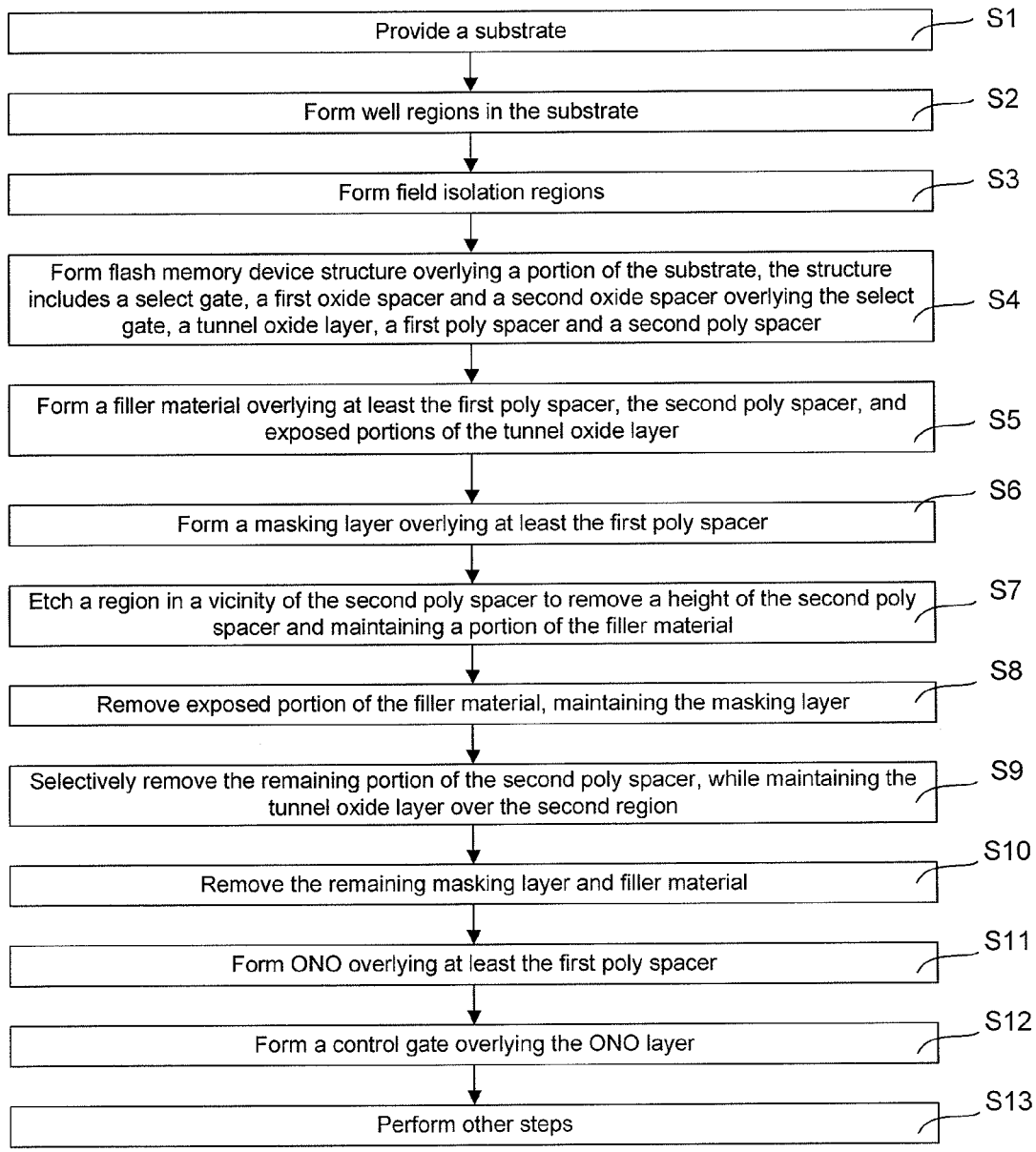
FIG. 3 is a simplified process flow diagram for a Flash memory device according to an embodiment of the present invention.
Figure 4:
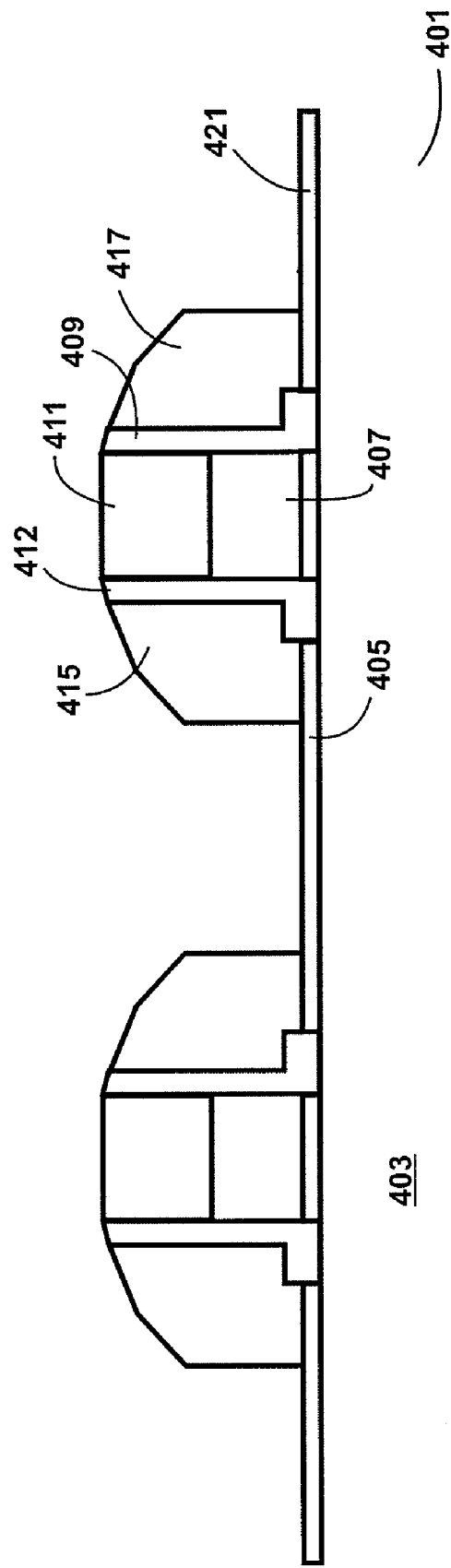
FIGS. 4 through 7 illustrate methods of fabricating a Flash memory device according to embodiments of the present invention.

FIG. 3 is simplified process flow diagram illustrating a method according to an embodiment of the present invention. The method may be outlined as follows:

1. Provide a semiconductor substrate having a surface region (S1);
2. Form a first well region and a second well region in the semiconductor substrate (S2);
3. Form field isolation regions (s3);
4. Form a flash memory device structure overlying a portion of the semiconductor substrate, the flash memory device (cell) structure having a select gate overlying the surface region and being interposed between the first and second well regions, a first oxide spacer formed overlying a first edge and a second oxide spacer formed overlying a second edge of the select gate, a tunnel oxide layer formed overlying the first well region of surface region and formed overlying the second well region of the surface region, a first poly spacer formed overlying the first oxide spacer on the first edge and a portion of the first region, a second poly spacer formed overlying the second oxide spacer on the second edge and a portion of the second region (S4);
5. Form a filler material comprising an organic non-conformal material overlying at least the first poly spacer, the second poly spacer, and an exposed portion of the tunnel oxide layer (S5);
6. Form a masking layer overlying at least the first poly spacer, while exposing a spatial region within a vicinity of the second poly spacer (S6);
7. Subject the spatial region within the vicinity of the second poly spacer to an etching process to remove a height of the second poly spacer, while maintaining a portion of the filler material (S7);
8. Remove an exposed portion of the filler material, while maintaining the masking layer (S8);
9. Selectively remove a remaining portion of the second poly spacer, while maintaining the tunnel oxide layer overlying the second well region (S9);
10. Removing any remaining filling material and the masking layer (S10);
11. Form an ONO layer overlying at least the first poly spacer (S11);
12. Form a control gate layer overlying the ONO layer (S12); and
13. Perform other steps, as desired (shown as step S13 in FIG. 3).

The above sequence of steps is a method according to an embodiment of the present invention. As shown, the present invention provides a method for forming a flash memory device (cell) structure using a selective etching technique for removing one of the polysilicon spacer structures without damaging a tunnel oxide layer according to a specific embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 4 through 7 illustrate methods of fabricating a Flash memory device (cell) according to embodiments of the present invention. These diagrams are merely examples, which should not unduly limit the scope of the claims herein. One of ordinary skill in the art would recognize many other variations, modifications, and alternatives. As shown, the method begins by providing a substrate 401, e.g., semiconductor substrate. Preferably, the substrate is a silicon wafer. Well regions 403 are formed within the substrate. The well region can include P-type type impurities or N-type impurities, depending upon the application.

The method forms field isolation regions within the substrate. The field isolation regions can be formed using a variety of techniques such as local oxidation of silicon, commonly called LOCOS, Alternatively, isolation regions can be formed using trench isolation structures. A surface of the silicon wafer is exposed and cleaned before formation of a gate dielectric layer, which serves as a tunnel oxide layer. The gate dielectric layer is formed overlying the surface of the substrate. The gate dielectric layer can be a high quality oxide layer, a silicon oxynitride layer, silicon nitride layer, any combination of these, and the like.

As shown, the flash memory device structure has a select gate 407 overlying the surface region. The select gate is made from a first polysilicon layer, which is formed overlying a gate dielectric layer. The gate dielectric layer insulates the select gate from the substrate. The first polysilicon layer is often blanket deposited and doped using implantation, diffusion, and in-situ doping techniques according to a specific embodiment. In a preferred embodiment, the select gate is doped using a phosphorous bearing impurity having a concentration ranging from about $1 \times 10^{19}$ atoms/cm$^3$ to about $1 \times 10^{21}$ atoms/cm$^3$ and greater. In an embodiment, the select gate has a channel length of 0.13 micron and less.

A first oxide spacer 409 is formed overlying a first edge of the select gate. The device also has a second oxide spacer 412 formed overlying a second edge of the select gate. The oxide spacers can be formed using thermal oxidation techniques, deposition techniques, or any combination of these, and the like. The oxide spacers are often made using a chemical vapor deposition process and has a thickness ranging from 100 Å to 400 Å. In a preferred embodiment, the oxide spacers have a thickness of about 300 Å and less. The oxide spacers can be formed using a single layer or multiple layers according to a specific embodiment. A tunnel oxide layer is formed overlying a first region 421 of the surface region and is also formed overlying a second region 405 of the surface region. The tunnel oxide layer has a thickness of 100 Angstroms and less according to a specific embodiment.

Referring again to FIG. 4, a first poly spacer 417 is formed overlying the first oxide spacer 409 on the first edge and is also formed overlying a portion of the first region. A second poly spacer 415 is formed overlying the second oxide spacer 412 on the second edge and is also formed overlying a portion of the second region. In a specific embodiment, the first and second poly spacers have a thickness of about 1000 Angstroms and less. A cap oxide layer 411 is formed overlying the select gate, as shown. The cap oxide layer is often formed along with the first polysilicon layer and patterned with it to form the cap structure, which protects the upper surface of the select gate. According to a preferred embodiment, the cap oxide layer has a thickness of about 1000 Angstroms and less.

Figure 5:
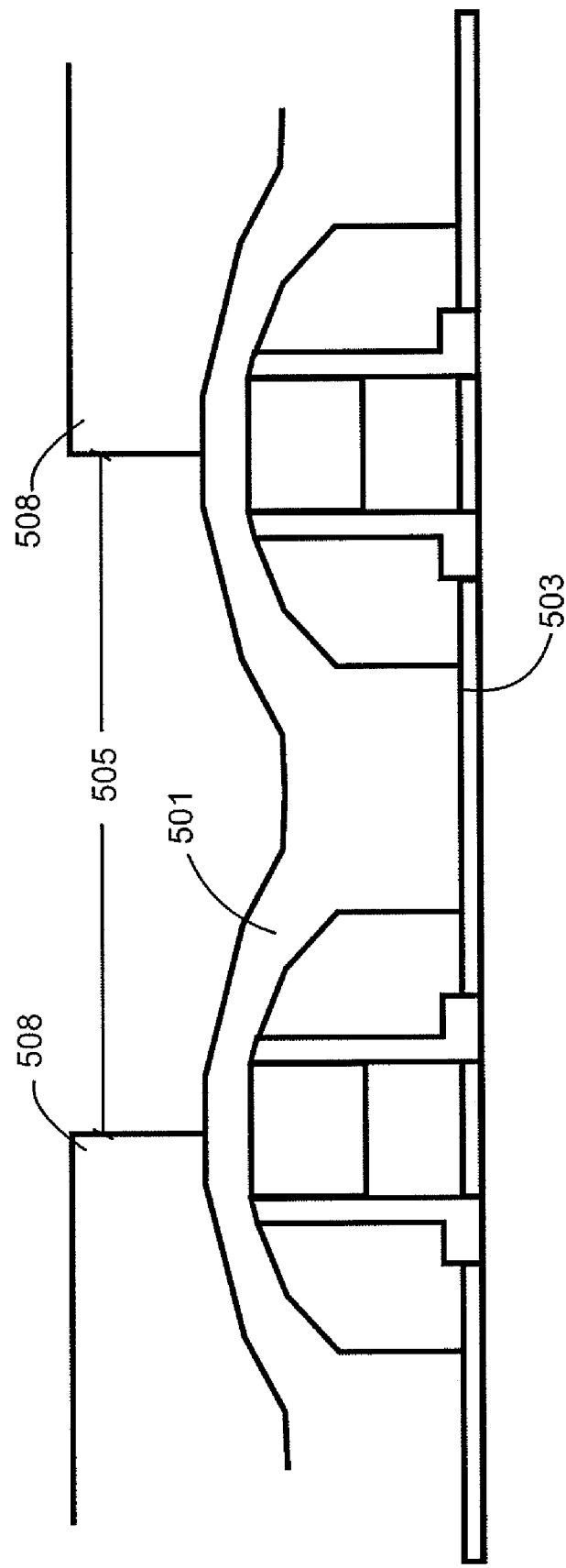

Referring to FIG. 5, the method includes forming a filler material 501 (e.g., organic material, barrier antireflective coating) overlying at least the first poly spacer, the second poly spacer, and an exposed portion 503 of the tunnel oxide layer. In a preferred embodiment, the filler material is an organic BARC material. As merely an example, such BARC material can be Ensemble ARC™ and manufactured by Brewer Science Inc. of Missouri, USA. In an alternative specific embodiment, the filler material is a non-conformal organic BARC material, which has a planarizing characteristic, as illustrated by reference numeral 501. Of course, there can be other variations, modifications, and alternatives.

Referring again to FIG. 5, the method includes forming a masking layer 508 overlying at least the first poly spacer, while exposing a spatial region 505 within a vicinity of the second poly spacer. The masking layer is preferably a photolithographic material such as a chemical amplified deep UV photoresist EPIC 3200™ manufactured by Rohm and Hass Company of Pennsylvania, USA, but can be others. The photoresist layer protects the first polysilicon spacer and a portion of the select gate, which is also protected by the cap oxide layer.

Figure 6:
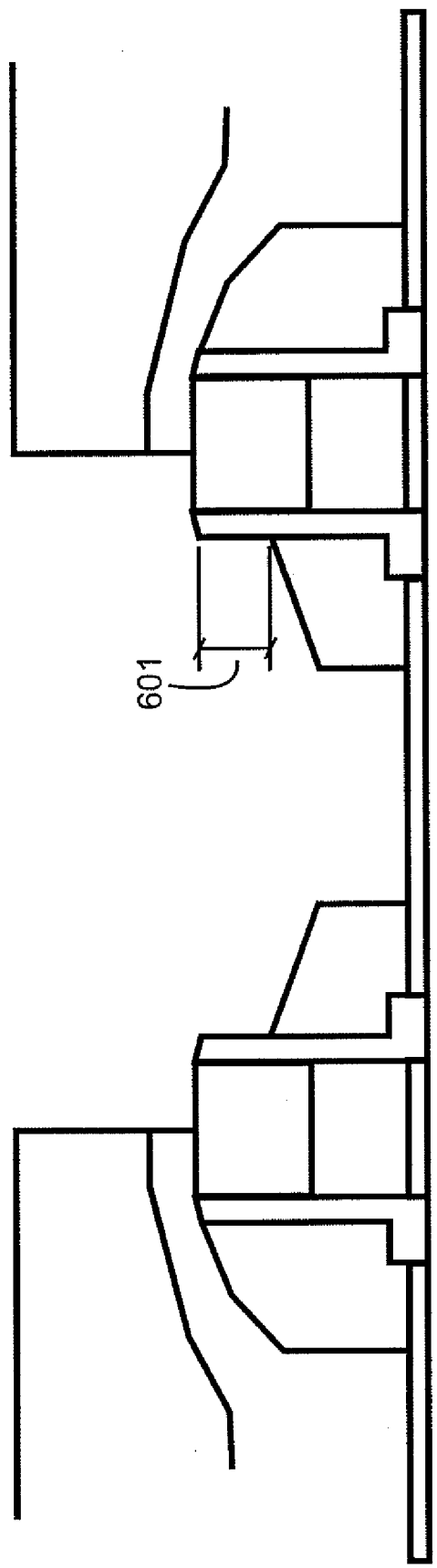

The method includes subjecting the spatial region within the vicinity of the second poly spacer to an etching process, as illustrated by FIG. 6. The etching process is provided to remove the exposed portion of the filler material in the spatial region and to remove a height 601 of the second poly spacer. As shown, a portion of the second poly spacer is maintained. Additionally, the method includes removing the exposed portion of the filler material, while maintaining the masking layer, as also shown.

Figure 7:
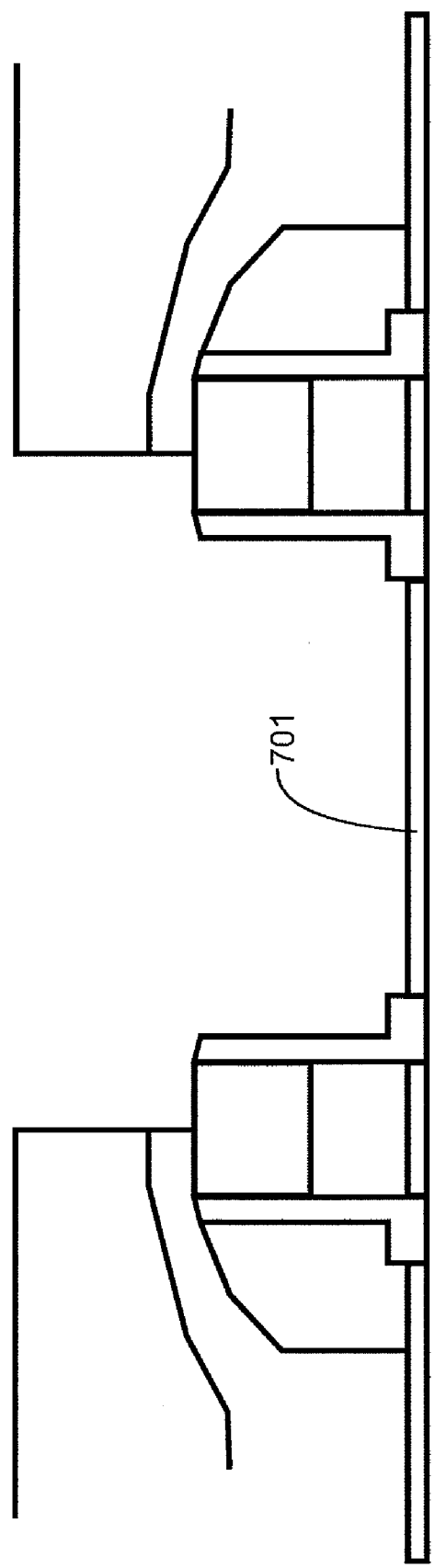

In a preferred embodiment, the method selectively removes a remaining portion of the second poly spacer, as illustrated by way of FIG. 7. In the preferred embodiment, the present method uses a HBr bearing species for a dry etching and maintains the tunnel oxide layer 701 overlying the second region. Since the present method uses the BARC layer to protect a portion of the tunnel oxide layer and provides the selective dry etching process to selectively remove the remaining second portion of the second poly spacer, it preserves the tunnel oxide layer overlying the active regions. Of course, there can be other variations, modifications, and alternatives.

To complete the device, the method includes removing the masking layer and any remaining filler material and forming an ONO (i.e., oxide on nitride on oxide) layer overlying at least the first poly spacer. The method also forms a control gate layer overlying the ONO layer. A completed device also includes passivation layer(s) and metallization layer(s) among others. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a flash memory device, the method comprising:
   providing a semiconductor substrate, the semiconductor substrate having a surface region;
   forming a flash memory device structure overlying a portion of the semiconductor substrate, the flash memory device structure having a select gate overlying the surface region, a first oxide spacer formed overlying a first edge and a second oxide spacer formed overlying a second edge of the select gate, a tunnel oxide layer formed overlying a first region of the surface region and formed overlying a second region of the surface region, a first poly spacer formed overlying the first oxide spacer on the first edge and a portion of the first region, a second poly spacer formed overlying the second oxide spacer on the second edge and a portion of the second region;
   forming a filler material overlying at least the first poly spacer, second poly spacer, and an exposed portion of the tunnel oxide layer;
   forming a masking layer overlying at least the first poly spacer, while exposing a spatial region within a vicinity of the second poly spacer;
   subjecting the spatial region within the vicinity of the second poly spacer to an etching process to remove a height of the second poly spacer, while maintaining a portion of the second poly spacer;
   removing exposed portions of the filler material, while maintaining the masking layer; and
   selectively removing a remaining portion of the second poly spacer.

2. The method of claim 1 wherein the selectively removing comprising using a selective dry etching process to remove the remaining portion of the second poly spacer while maintaining the second oxide spacer and the tunnel oxide layer in the second region.

3. The method of claim 2 wherein the selective dry etching process uses a HBr bearing species.

4. The method of claim 1 wherein the tunnel oxide layer has a thickness of 100 Angstroms and less.

5. The method of claim 1 wherein the select gate has a channel length of 0.13 micron and less.

6. The method of claim 1 wherein the first poly spacer is a floating gate structure.

7. The method of claim 1 wherein the filler material comprises an organic BARC material.

8. The method of claim 1 wherein the filler material comprises a non-conformal organic BARC material.

9. The method of claim 1 wherein the tunnel oxide layer is overlying an active silicon bearing material in the semiconductor substrate.

10. The method of claim 1 wherein the second poly spacer is in-situ doped using phosphorous bearing impurities.

11. The method of claim 1 wherein the flash memory device structure comprises a cap oxide layer overlying the select gate.

12. The method of claim 11 wherein the cap oxide layer is about 1000 Angstroms and less.

13. The method of claim 1 wherein the first oxide spacer has a thickness of about 300 Angstroms and less and the second oxide spacer has a thickness of about 300 Angstroms and less.

14. The method of claim 1 wherein the first poly spacer has a thickness of about 1000 Angstroms and less.

15. The method of claim 1 further comprising removing the masking layer and any remaining filler material.

16. The method of claim 15 further comprising forming an ONO layer overlying at least the first poly spacer.

17. The method of claim 16 further comprising forming a control gate overlying the ONO layer.

18. A method for fabricating a flash memory cell, the method comprising:

providing a semiconductor substrate, the semiconductor substrate having a surface region including a first region and a second region;

forming a flash memory cell structure overlying the surface region, the flash memory cell structure being interposed between the first and second regions of the surface region and having a select gate overlying the surface region, a first oxide spacer formed overlying a first edge and a second oxide spacer formed overlying a second edge of the select gate, a tunnel oxide layer formed overlying the first and second regions, a first poly spacer formed overlying the first oxide spacer on the first edge and a portion of the tunnel oxide layer overlying the first region, a second poly spacer formed overlying the second oxide spacer on the second edge and a portion of the tunnel oxide layer overlying the second region;

forming a filler material comprising an organic non-conformal material overlying at least the first poly spacer, the second poly spacer, and an exposed portion of the tunnel oxide layer;

forming a masking layer overlying at least the first poly spacer, while exposing a spatial region within a vicinity of the second poly spacer;

subjecting the spatial region within the vicinity of the second poly spacer to an etching process to remove a height of the second poly spacer, while maintaining a portion of the second poly spacer and removing exposed portions of the filler material, while maintaining the masking layer; and selectively removing a remaining portion of the second poly spacer, while maintaining the tunnel oxide layer overlying the second region.

19. The method of claim 18 wherein the second region is an active silicon region.

20. The method of claim 18 further comprising forming an ONO layer overlying at least the first poly spacer and forming a control gate layer overlying the ONO layer.

* * * * *